United States Patent
Liu

(10) Patent No.: US 10,270,478 B2
(45) Date of Patent: Apr. 23, 2019

(54) NON-LINEAR TRANSMITTER PRE-CODING

(71) Applicant: NORTHROP GRUMMAN SYSTEMS CORPORATION, Falls Church, VA (US)

(72) Inventor: Daniel N. Liu, Torrance, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 270 days.

(21) Appl. No.: 14/809,948

(22) Filed: Jul. 27, 2015

(65) Prior Publication Data

US 2017/0033809 A1 Feb. 2, 2017

(51) Int. Cl.
| | |
|---|---|
| H03F 1/32 | (2006.01) |
| H04B 1/04 | (2006.01) |
| H04L 25/03 | (2006.01) |
| H04L 27/08 | (2006.01) |

(52) U.S. Cl.
CPC ............. *H04B 1/04* (2013.01); *H03F 1/3247* (2013.01); *H03F 1/3258* (2013.01); *H04L 25/03343* (2013.01); *H04L 27/08* (2013.01); *H04B 2001/0425* (2013.01)

(58) Field of Classification Search
CPC . H04B 1/04; H04B 2001/0425; H04L 27/367; H04L 27/368
See application file for complete search history.

(56) References Cited

U.S. PATENT DOCUMENTS

| | | | | |
|---|---|---|---|---|
| 5,291,291 A | * | 3/1994 | Eilers | H04N 5/4401 348/21 |
| 6,801,086 B1 | * | 10/2004 | Chandrasekaran | H03F 1/3247 330/140 |
| 6,970,511 B1 | * | 11/2005 | Barnette | H03H 17/0621 375/240.21 |
| 7,688,979 B2 | | 3/2010 | Reznik et al. | |
| 8,009,757 B2 | | 8/2011 | Mroueh et al. | |

(Continued)

OTHER PUBLICATIONS

Chatzinotas et al., Cooperative and Cognitive Satellite Systems, May 27, 2015, Academic Press, pp. 124-134.*

(Continued)

*Primary Examiner* — David B Lugo
(74) *Attorney, Agent, or Firm* — John A. Miller; Shumaker, Loop & Kendrick, LLP

(57) ABSTRACT

A method for pre-coding a digital signal in a transmitter associated with a digital communications system to remove non-linear distortions. The method converts digital bits to be transmitted to a transmit constellation including symbols defining a plurality of the bits and subtracting a modeled constellation from the transmit constellation to provide a pre-coded constellation. The method performs a modulo operation on the pre-coded constellation to limit the number of symbols that are transmitted at any particular point in time and models the pre-coded constellation after the modulo operation using a Volterra series model, where a plurality of terms in the Volterra series are separately modeled and each modeled term of the constellation is added together to provide the modeled constellation. The method filters the pre-coded constellation to interpolate a symbol sequence in the constellation and shape the constellation and converts the shaped constellation to an analog signal to be transmitted.

18 Claims, 2 Drawing Sheets

(56) References Cited

U.S. PATENT DOCUMENTS

| | | | |
|---|---|---|---|
| 8,165,189 B2 | 4/2012 | Liu et al. | |
| 8,204,142 B2 | 6/2012 | Hwang et al. | |
| 8,218,667 B2 | 7/2012 | Lee et al. | |
| 8,238,471 B2 | 8/2012 | Hwang et al. | |
| 8,320,432 B1 | 11/2012 | Chockalingam et al. | |
| 8,385,820 B2 | 2/2013 | Larsson et al. | |
| 8,401,112 B2 | 3/2013 | Chao | |
| 8,489,047 B2 | 7/2013 | McCallister et al. | |
| 8,532,215 B2 | 9/2013 | Huang et al. | |
| 8,704,595 B2 | 4/2014 | Kim et al. | |
| 2004/0257157 A1* | 12/2004 | Sahlman | H03F 1/3258 330/149 |
| 2005/0021319 A1* | 1/2005 | Li | G06F 17/504 703/2 |
| 2010/0246715 A1 | 9/2010 | Dao et al. | |
| 2011/0188550 A1* | 8/2011 | Wajcer | H04L 25/068 375/214 |
| 2011/0191656 A1* | 8/2011 | Bliss | H03M 13/05 714/776 |
| 2013/0259156 A1 | 10/2013 | Baligh et al. | |
| 2014/0133848 A1 | 5/2014 | Koike-Akino et al. | |
| 2015/0043323 A1* | 2/2015 | Choi | H04L 5/143 370/203 |
| 2015/0103952 A1* | 4/2015 | Wang | H04L 27/368 375/297 |
| 2015/0162881 A1* | 6/2015 | Hammi | H03F 3/189 330/291 |
| 2015/0270856 A1* | 9/2015 | Breynaert | H04L 27/3488 375/296 |

OTHER PUBLICATIONS

Kambanellas et al., "Modulo Pre-Equalization of Nonlinear Communication Channels," May 1999, 2nd IEEE Workshop on Signal Processing Advances in Wireless Communications, pp. 46-49.*

Taylor series. Encyclopedia of Mathematics. URL: http://www.encyclopediaofmath.org/index.php?title=Taylor_series&oldid=31211, revised Dec. 2013.*

Zu, Keke, et al. "Multi-Branch Tomlinson-Harashima Precoding Design for MU-MIMO Systems: Theory and Algorithms" IEEE Transactions on Communications, vol. 62, No. 3, Mar. 2014, pp. 939-951.

Abd-Elrady, Emad, et al. "Adaptive Predistortion of Nonlinear Volterra Systems Using Spectral Magnitude Matching" IEEE 2009, pp. 2985 2988.

Beidas, Bassel F. et al. "Multicarrier Successive Predistortion for Nonlinear Satellite Systems" IEEE Transactions on Communications, vol. 63, No. 4, Apr. 2015, pp. 1373-1382.

Li, Zhengdai et al. "Application of Signal Processing Worksystem Simulation in Look-Up Table Prodistorter Design" International Conference on Computer Application and System Modeling (ICCASM) 2010, pp. V15-298-V15-303.

Karam, Georges, et al. "A Data Predistortion Technique with Memory for QAM Radio Systems" IEEE Transactions on Communications New York, USA vol. 39, No. 2, Feb. 1991, pp. 336-343.

* cited by examiner

NON-LINEAR TRANSMITTER PRE-CODING

BACKGROUND

Field

This invention relates generally to a system and method for providing non-linear transmitter pre-coding for a transmit signal in a satellite communications system so as to reduce non-linear distortions in the signal and, more particularly, to a system and method for providing non-linear transmitter pre-coding for a transmit signal in a satellite communications system so as to reduce non-linear distortions in the signal, where the pre-coding includes combining dirty paper coding and non-linear high power amplifier (HPA) modeling, such as Volterra series modeling, of the transmit signal.

Discussion

Satellite communications is seeing a growing demand for greater throughput and transponders with more DC power efficiency. To provide greater spectral efficiency, satellite communications systems often employ modern coding and modulation, which is best exemplified by the known digital video broadcasting (DVB)-S2 standard and protocol. Code concatenation is an effective way to achieve large coding gains while maintaining the decoding complexity to be manageable. However, ever since the discovery of "turbo-codes" it has been widely acknowledged that the iterative processing techniques are not limited to conventional concatenated error correction codes, and the so-called "turbo principle" is more generally applicable to many other components found in modern digital communications. One such example is iterative de-mapping and decoding in coded modulation communications systems. Coded M-ary amplitude phase shift keying (APSK) is now the "de-facto" bandwidth-efficient modulation technique for digital satellite communications.

In order to meet the radiated power demands necessary for the signal transmission distances, satellite communications systems typically employ high power amplifiers (HPAs), such as traveling-wave tube amplifiers (TWTAs) or solid-state power amplifiers (SSPA). To provide high throughput and increased efficiency, these HPAs often operate at or near their saturation level, which typically results in significant non-linear distortions of the transmitted signal that has a reverse effect on the throughput and performance of the communications channel. M-ary APSK provides a power-efficient and spectral-efficient solution with its inherent robustness against highly non-linear distortion. However, the implementation of satellite communications channels still provides significantly different design challenges from traditional terrestrial channels due to their dominant non-linear behavior.

In a typical wireless digital signal transmitter for satellite communications or otherwise, the transmitter includes digital components that convert the digital bits at a particular point in time into an in-phase and quadrature-phase symbol constellation for transmission. However, these components include memory in that the symbol transmitted at a particular point in time includes artifacts from previously transmitted symbols that interfere with the desired transmit signal. Particularly, each symbol transmitted at a particular point in time will include significant interference from the previous symbols, where the actual transmitted symbol at a particular point in time includes the desired signal and interference from the signal in previous time slots. Further, the channel impulse response in the channel creates inter-symbol interference (ISI) in the signal, also causing signal distortions.

For those digital communications systems that cause non-linear signal distortions in the channel, some type of signal correction is typically required. Transmitter pre-coding (TPC) is a known technology in the communications art where the transmitter produces an estimate of the forward channel that is used to remove the anticipated non-linear distortions before the signal is transmitted so that the complexity associated with signal demodulation is provided in the transmitter and not in the receiver. One known TPC technique is referred to in the art as dirty paper coding, which relies on the concept that if the transmitter understands the forward communications channel, the transmitted signal can be altered so that when it is transmitted over the channel, the pre-coding compensates the interference of the channel so that the desired signal is clean when it is received by the receiver. In order to pre-code each symbol that is transmitted so that it only includes the desired signal symbol component, the transmitter subtracts the combined effect of the symbol of the previous time samples for the current symbol being transmitted so that only the desired symbol is actually transmitted.

For transmitter pre-coding in a typical digital subscriber line (DSL) communications system, the transmitter generally only needs to learn the channel one time at the beginning of the wireless transmission session because the channel will remain substantially constant for a relatively long period of time. For example, the transmitter may transmit a pilot tone to the receiver and based on how that signal changes in the channel will allow the transmitter to modulate the signal using a suitable pre-coding technique. However, for cellular wireless transmission, the ability to learn the forward channel (down-link) is much more complicated because the channel is constantly changing as a result of, for example, movement of the receiver, for example, a user terminal. In a typical cellular communications system, the cell phone receiver constantly transmits a feedback signal back to the transmitter in the base station at a different frequency (up-link) than the received signal, which is used for pre-coding purposes. However, by the time the transmitter receives the forward channel estimate signal from the receiver, the receiver has likely moved to a different location for the next transmission, where the previously received forward channel estimate may no longer be accurate. For satellite communications signals, the forward channel typically is not changing very rapidly, where forward channel estimates can be more accurately obtained.

Various techniques are known in the art for providing transmitter pre-coding in satellite communications systems. One known TPC technique is referred to as symbol pre-distortion without memory that primarily focuses on the non-linear effects caused by the HPA. However, this technique has limited performance and throughput. A second known TPC technique is referred to as symbol pre-distortion with memory, which also primarily focuses on the non-linear effects caused by the HPA. A third known technique is referred to as linear pre-equalization, which primarily focuses on removing channel generated distortion where the complexity depends on the forward channel.

DETAILED DESCRIPTION OF THE EMBODIMENTS

The following discussion of the embodiments of the invention directed to a transmitter pre-coding (TPC) technique for a satellite communications system is merely exemplary in nature, and is in no way intended to limit the invention or its applications or uses. For example, as mentioned, the TPC technique of the invention has particular application for a satellite communications system. However, as will be appreciated by those skilled in the art, the TPC technique may have application for other wireless communications systems.

Figure 1:
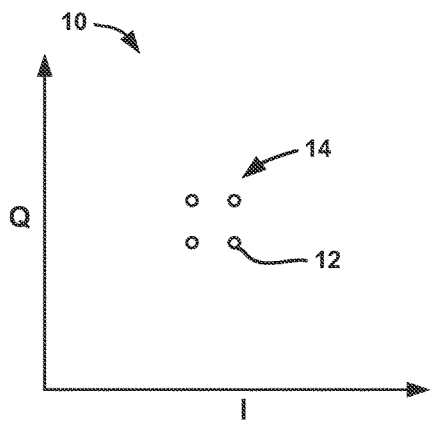
FIG. 1 is an illustration of a digital signal constellation including symbols.

FIG. 1 is an illustration of an ideal complex coded digital signal symbol constellation 10 where in-phase values are on the horizontal axis and quadrature-phase values are on the vertical axis. The constellation 10 includes an array of points or symbols 12, where each symbol 12 represents a number of bits depending on the M-ary APSK modulation order, and where a number of the symbols 12 are provided in concentric rings 14, here a single ring, around a common center. The number of the rings 14 and the number of the symbols 12 in each ring 14 defines the constellation design of the digital signal constellation.

Figure 2:
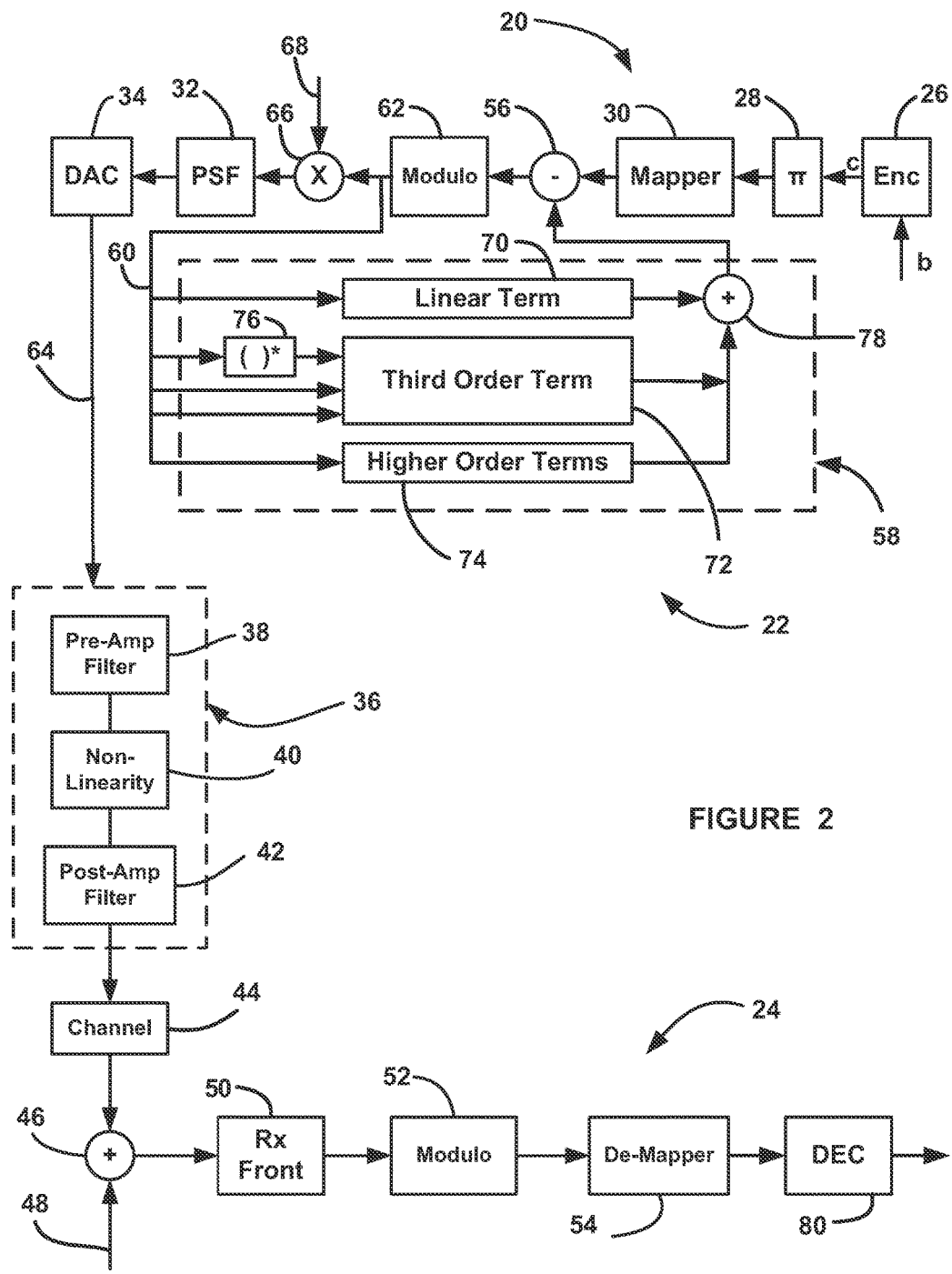
FIG. 2 is a block diagram of a satellite communications system employing transmitter pre-coding using Volterra modeling.

FIG. 2 is a block diagram of a satellite communications system 20 including a transmitter 22 and a receiver 24, where the transmitter 22 and the receiver 24 can be either on a satellite or at a ground station. The transmitter 22 includes an encoder 26 that receives a signal b having a stream of bits to be transmitted, where the encoder 26 encodes the signal b depending on the particular architecture being employed, for example, the DVB-S2 protocol, and generates a coded bit sequence signal $c=[c_1 \ldots c_{KM_c}]^T$. The coded digital signal c from the encoder 26 is sent to an interleaver 28 that redistributes the sequence of bits in the coded bit sequence signal c to increase the performance of the transmitter 22 by reducing the chance that bursty errors corrupt a group of bits that would exceed the systems error correction coding capability.

The interleaved bit signal from the interleaver 18 is then sent to a mapper 30 that translates and modulates the interleaved bits into a constellation having rings of symbols, such as the constellation shown in FIG. 1, where each symbol defines a group of bits. For example, the mapper 30 may employ M-ary amplitude phase shift keying (APSK) that provides in-phase and quadrature-phase bits for each symbol that is transmitted. More particularly, $M_c$ consecutive bits of c are grouped to form a subsequence of bits $c_k=[c_k(1), \ldots, c_k(M_c)]$. Each sequence of bits $c_k$ is then mapped to a complex symbol $x(k)=\mu(c_k)$ by bit-to-symbol mapping $\mu$. The coded modulation spectral efficiency is $R=rM_c$, where r is the actual coding rate.

The symbol signal from the mapper 30 is a sequence of in-phase and quadrature-phase complex values, where each group of values identifies one of the symbols in the constellation. In one example, the coded bit sequence signal $c=[c_1 \ldots c_{KM_c}]^T$ can be mapped into a block of K coded symbols x that generates a set of K-coded information symbols $x=[x(1) \ldots x(K)]^T$. It is assumed that the symbols are equally likely chosen from a complex constellation X with cardinality $|X|=2^{M_c}$, where the cardinality $|X|$ is the number of points in the set of x ordered constellation symbols, which have an average symbol energy $E_x=E|x(k)|^2$.

The symbol signal from the mapper 30 is sent to a differencer 56 that subtracts non-linear interference from the signal in a TPC operation using, for example, Volterra series modeling in a non-linear modeling block 58, as will be discussed in further detail below, where the output of the differencer 56 is a pre-coded symbol signal. The pre-coded symbol signal from the differencer 56 is sent to a modulo box 62 that performs a known modulo operation on the symbols to limit the number of symbols that are transmitted at any particular point in time so that those symbols that contribute to the interference in each transmitted symbol are contained within a certain area of the symbol representation, such as the fundamental region.

In precise mathematical form, the modulo operation is defined as $[u]_\Lambda$. The modulo operation performed in the box 62 can be separated into two distinct steps, namely, lattice quantization and modulo-lattice reduction, where the input to the modulo box 62 is the vector u. For the lattice quantization let $u \in \mathbb{C}^n$, then:

$$Q_\Lambda(u) = \underset{\lambda \in \Lambda}{\operatorname{argmin}} \|u - \lambda\|. \tag{1}$$

In other words, for a given vector u the lattice-quantized point $Q_\Lambda(u)$ is the lattice point closest to the vector u.

For the modulo-Lattice reduction let $u \in \mathbb{C}^n$, then:

$$[u]_\Lambda = u - Q_\Lambda(u). \tag{2}$$

Figure 3:
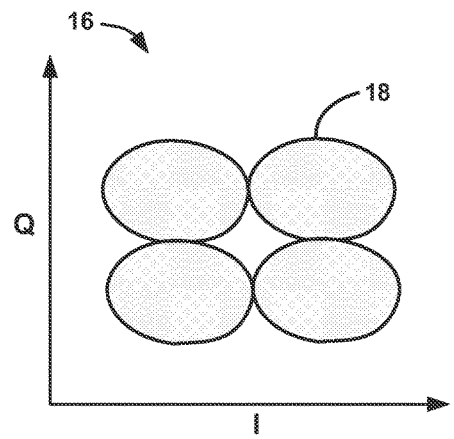
FIG. 3 is an illustration of a digital signal constellation of the symbols at the output of a modulo operation shown in FIG. 1.

Thus, the modulo operation limits the amount of energy that the transmitter 22 can transmit. A general representation of the constellation shown in FIG. 1 at the output of the modulo box 62 is shown in FIG. 3 as constellation 16 including symbol spaces 18. A feedback signal on line 60 from the modulo box 62 is provided to the non-linear modeling box 58 to provide the TPC operation.

The pre-coded signal from the modulo box 62 is multiplied by factor $1/h_1(0)$ provided on line 68 at a multiplier 66 and then is provided to a square-root raised cosine (SRRC) pulse-shaping filter (PSF) 32 that interpolates the symbol sequence and shapes the signal as a raised cosine for converting the digital signal to an analog signal. The filtered symbols are then converted to an analog signal by a digital-to-analog converter (DAC) 34 on line 64 for transmission, where the analog output signal from the DAC 34 is the baseband equivalent of the transmitted signal at time t.

The analog output signal from the DAC 34 is sent to a high power amplifier (HPA) 36 in the transmitter 22 for transmission. The HPA 36 includes a pre-amplifier filter 38 that filters the transmit signal and provides the filtered signal to a memoryless non-linearity amplifier 40 for amplification. The amplified signal is then filtered by a post-amplifier filter 42 before it is transmitted by the transmitter 22 on a channel 44 from the satellite or the ground station as an analog signal.

As mentioned, the present invention proposes, in one example, employing Volterra series modeling $f_{Volterra}(\cdot)$ to model a non-linear satellite digital communications channel in the HPA 36, so that the modeling can be employed in a TPC operation, such as dirty paper coding, of the type discussed above. Volterra series decomposition is a known mathematical model for modeling non-linear behavior and provides an efficient and analytically tractable way to represent a non-linear satellite communications channel. Generally, a Volterra series is an infinite polynomial description of a signal. By modeling the HPA 36 in this manner, the TPC operation can remove the anticipated non-linear ISI interference before the signal is transmitted by the transmitter 22. In one embodiment, the Volterra series model is defined as:

$$y_n = \sum_{n_1=0}^{N-1} h_1(n_1) X_{n-n_1} + \sum_{n_1=0}^{N-1}\sum_{n_2=0}^{N-1}\sum_{n_3=0}^{N-1} h_3(n_1, n_2, n_3) X_{n-n_1} X_{n-n_2} X_{n-n_3}^* + \sum_{n_1=0}^{N-1}\sum_{n_2=0}^{N-1}\sum_{n_3=0}^{N-1}\sum_{n_4=0}^{N-1}\sum_{n_5=0}^{N-1} h_5(n_1, n_2, n_3, n_4, n_5) X_{n-n_1} X_{n-n_2} X_{n-n_3} X_{n-n_4}^* X_{n-n_5}^* + \ldots \quad (3)$$

where $h_p(n_1, n_2, \ldots, n_p)$, are Volterra series coefficients of the pth order and $h_1(0)$ is the first leading coefficient.

In this embodiment, the transmitter pre-coding is performed in the fractional space after the signal to be transmitted has undergone the modulo operation in the modulo box 62. The HPA 36 is estimated in the non-linear modeling block 58 using the Volterra series model shown in equation (3) in the block 58, where the linear term of the model is shown in equation (4) below and is modeled in block 70, the third-order term of the model is shown in equation (5) below and is modeled in block 72, and all of the odd higher order terms above the third-order term are generally modeled in block 74. There are three inputs to the third order term box 72 as required for each z variable by the third-order term of the Volterra series equation, where z refers to a delay element. One of the inputs to the third order term goes through a complex conjugate box 76 for z*. There would also be the number of inputs required for the higher order terms to the box 74.

$$\sum_{n_1=1}^{N-1} \frac{h_1(n_1)}{h_1(0)} z^{-1} \quad (4)$$

$$\sum_{n_1,n_2,n_3=0}^{N-1} \frac{h_3(n_1, n_2, n_3)}{|h_1(0)|^2 h_1(0)} z^{-n_1} z^{-n_2} (z^*)^{-n_3} \quad (5)$$

All of the modeled signals from the boxes 70, 72 and 74 are added together at summation block 78 and then subtracted from the output of the mapper 30 in the differencer 56 so that the signal that is transmitted on the channel 44 is pre-distorted with the non-linearization provided by the high power amplifier 36.

As mentioned above, Volterra series modeling is one suitable non-linear modeling that can be used to decompose the non-linear channel 44 as caused by the HPA 36. Several other examples of non-linear modeling techniques are discussed below that can replace the Volterra series modeling with the understanding that other modeling techniques may also be available.

One other applicable non-linear modeling technique is known as a memory polynomial model, which is widely used for behavioral modeling and digital pre-distortion of power amplifiers and transmitters exhibiting memory effects. Memory polynomial model basically corresponds to a reduction of the Volterra series in which only selective terms are kept. The output waveform of the model is:

$$x_{out}(n) = \sum_{j=0}^{M} \sum_{i=1}^{N} a_{ji} \cdot x_{in}(n-j) \cdot |x_{in}(n-j)|^{i-1}, \quad (6)$$

where $x_{out}$ is the output of the HPA 36, $x_{in}$ is the input of the HPA 36, N and M are the nonlinearity order and the memory depth of a device under test (DUT), respectively, and $a_{ji}$ are the model coefficients.

For the memory polynomial model:

$$x_{out} = f_{MP}(x_{in}), \quad (7)$$

where the function $f_{MP}(\cdot)$ denotes the memory polynomial model.

Another applicable non-linear modeling technique is known as a Wiener model $f_{Wiener}(\cdot)$, which is a two-box model composed of a linear finite impulse response (FIR) filter followed by a memoryless non-linear function. The output waveform of the Wiener model is give by:

$$x_{out}(n) = G(|x_1(n)|) \cdot x_1(n), \quad (8)$$

where $G(|x_1(n)|)$ is the memoryless instantaneous gain function implemented in a look-up table, and $x_1(n)$ designates the output of the FIR filter as:

$$x_1(n) = \sum_{j=0}^{M} h(j) \cdot x_{in}(n-j), \quad (9)$$

and where h(j) are the coefficients of the FIR filter impulse response, and M is the memory depth of the DUT.

Another applicable non-linear modeling technique is known as a Hammerstein model $f_{Hammerstein}(\cdot)$, where static non-linearity is applied upstream of the linear filter, and where the output waveform is give by:

$$x_{out}(n) = \sum_{j=0}^{M} h(j) \cdot x_1(n-j), \quad (10)$$

and:

$$x_1(n) = G(|x_1(n)|) \cdot x_1(n), \quad (11)$$

where $x_1(n)$, h(j) and $G(|x_1(n)|)$ refer to the output of a look-up table, the impulse response of the FIR filter and the instantaneous gain of the look-up table model, respectively, and M is the memory depth of the DUT.

Another applicable non-linear modeling technique is known as a look-up table (LUT) direct model $f_{LUT}(\cdot)$, where the instantaneous gain of the DUT is a function of the actual input sample $x_{in}(n)$ and the M−1 preceding samples as:

$$|x_{in}(n-1), x_{in}(n-2), x_{in}(n-3), \ldots, x_{in}(n-M)|, \quad (12)$$

where M is the memory depth of the DUT. Hence, the LUT size is $K^{M-1}$, where K is the number of bins required for the memoryless LUT model, and where the output waveform is given by:

$$x_{out}(n) = G(|x_1(n)|) \cdot x_{in}(n), \quad (13)$$

where $G(|x_1(n)|)$ is the instantaneous complex gain of the DUT, $x_{in}(n)$ is the input vector including the present and the M−1 preceding samples, and $x_{in}(n)$ is defined as:

$$|x_1(n)| = |x_{in}(n), x_{in}(n-1), x_{in}(n-2), \ldots, x_{in}(n-M)|. \quad (14)$$

Any two linear combinations of the above described non-linear models can also serve as the non-linear modeling in the system 20. For example, if $\lambda_1 + \lambda_2 = 1$, then the non-linear modeling is given by:

$$f(\cdot) = \lambda_1 \cdot f_{Volterra}(\cdot) + \lambda_2 \cdot f_{LUT}(\cdot), \quad (15)$$

and forms a completely valid non-linear modeling of the system 20.

Another non-linear modeling example includes:

$$f(\cdot) = \lambda_1 \cdot f_{Wiener}(\cdot) + \lambda_2 f_{Hammerstein}(\cdot). \quad (16)$$

Another non-linear modeling example includes:

$$f(\cdot) \equiv \lambda_1 \cdot f_{MP}(\cdot) + \lambda_2 f_{LUT}(\cdot). \quad (17)$$

Further, any multiple (>2) combination of the above described non-linear functions can also serve as the modeling in the system 20. For example:

$$f(\cdot) \equiv \lambda_1 \cdot f_{Volterra}(\cdot) + \lambda_2 \cdot f_{Wiener}(\cdot) + \lambda_3 \cdot f_{Hammerstein}(\cdot) + \lambda_4 f_{LUT}(\cdot), \quad (18)$$

where N=4.

Another non-linear modeling example with N=3 could be:

$$f(\cdot) \equiv \lambda_1 \cdot f_{wiener}(\cdot) + \lambda_2 \cdot f_{Hammerstein}(\cdot) + \lambda_3 \cdot f_{LUT}(\cdot). \quad (19)$$

Further, any non-linear combination of the above non-linear functions according to Taylor series expansions can serve as the modeling in the box 58. For example:

$$f(\cdot) \equiv \sum_{n=0}^{\infty} \frac{f_{Volterra}^{(n)}(a)}{n!} (x-a)^n, \quad (20)$$

where $f^{(n)}$ denotes the $n^{th}$ derivative of the function $f$.

Another non-linear modeling example could be:

$$f(\cdot) \equiv \sum_{n=0}^{\infty} \frac{f_{MP}^{(n)}(a)}{n!} (x-a)^n. \quad (21)$$

One of the key features of the system 20 is individual device dependent. Also, straight forward realization of the above non-linear functions would easily result in in-tractable complexity due to modeling complexity is very large, soon becomes intractable. The current invention only selects "important" terms from the above modeling and only used those terms as "non-linear" channel coefficients in the non-linear TPC computation.

Figure 4:
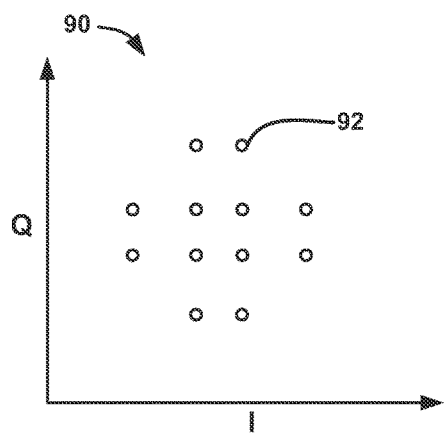
FIG. 4 is an illustration of a digital signal constellation including symbols at the input to a modulo operation in the receiver.

The receiver 24 receives the analog symbol sequence signal on the channel 44 at the ground station, or otherwise, where additive white Gaussian noise (AWGN) provided on line 48 is added to the receive signal to provide modeling for thermal background noise at a summation junction 46 to provide a modified receive signal. The modified receive signal is provided to a receiver front-end 50 where the analog signal is down-converted and the carrier signal is removed to provide a symbol constellation of the signal, such as symbol constellation 90 including symbols 92 shown in FIG. 4. The symbol signal from the front-end 50 is converted to a digital signal by a modulo operation in box 52 in a manner that is well understood by those skilled in the art. The modulo operation recovers a one sample per symbol version of the digital signal that provides a symbol having an in-phase and quadrature-phase value on the constellation to provide a symbol constellation, such as shown in FIG. 1. The digital signal from the modulo box 52 is provided to an inner soft-input/soft-output (SISO) de-mapper 54 that removes the bits in the symbol constellation, which are then sent to a decoder 80 that decodes the bits to provide the received bit stream b.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for non-linear pre-coding a single carrier digital signal in a transmitter associated with a digital communications system to remove non-linear distortions in a transmitted signal, said method comprising:
   converting digital bits to be transmitted to a transmit constellation including symbols each defining a plurality of the bits;
   subtracting a revised pre-coded constellation from the transmit constellation to provide a current pre-coded constellation;
   performing a modulo operation on the current pre-coded constellation to limit the number of symbols that are transmitted at any particular point in time;
   modeling the current pre-coded constellation after the modulo operation using a non-linear model to provide the revised pre-coded constellation, wherein modeling the current pre-coded constellation includes using a non-linear combination of different non-linear models where the different non-linear models are independent of each other and are simultaneously present during the modeling, wherein the non-linear combination of the different non-linear models includes directly evaluating a non-linear function with each of the non-linear models, and wherein the non-linear function is a Taylor series, general power series or any sub-set or combination of a Taylor series and general power series;
   filtering the current pre-coded constellation in a pulse-shaping filter so as to interpolate a symbol sequence in the constellation and shape the constellation;
   converting the shaped pre-coded constellation to an analog signal to be transmitted; and
   amplifying the analog signal in a high power amplifier for transmission.

2. The method according to claim 1 wherein modeling the current pre-coded constellation using a non-linear model includes modeling the current pre-coded constellation using a Volterra series model, where a plurality of terms in the Volterra series are separately modeled and each modeled term of the constellation is added together to provide the modeled constellation.

3. The method according to claim 2 wherein modeling the current pre-coded constellation using a Volterra series model includes using the equation:

$$y_n = \sum_{n_1=0}^{N-1} h_1(n_1) X_{n-n_1} + \sum_{n_1=0}^{N-1} \sum_{n_2=0}^{N-1} \sum_{n_3=0}^{N-1} h_3(n_1, n_2, n_3) X_{n-n_1} X_{n-n_2} X_{n-n_3}^* +$$

-continued $$\sum_{n_1=0}^{N-1}\sum_{n_2=0}^{N-1}\sum_{n_3=0}^{N-1}\sum_{n_4=0}^{N-1}\sum_{n_5=0}^{N-1} h_5(n_1, n_2, n_3, n_4, n_5)$$

$$X_{n-n_1} X_{n-n_2} X_{n-n_3} X^*_{n-n_4} X^*_{n-n_5} + \dots$$

where $h_p(n_1, n_2, \dots, n_p)$ are Volterra series coefficients of pth order and $h_1(0)$ is the first leading coefficients.

4. The method according to claim 3 wherein modeling the current pre-coded constellation using a Volterra series model includes modeling the linear term of the Volterra series using the expression:

$$\sum_{n_1=1}^{N-1} \frac{h_1(n_1)}{h_1(0)} z^{-1},$$

and modeling the third-order term in the Volterra series using the expression:

$$\sum_{n_1,n_2,n_3=0}^{N-1} \frac{h_3(n_1, n_2, n_3)}{|h_1(0)|^2 h_1(0)} z^{-n_1} z^{-n_2} (z^*)^{-n_3}.$$

5. The method according to claim 1 wherein modeling the current pre-coded constellation using a non-linear model includes modeling the current pre-coded constellation using a memory polynomial model.

6. The method according to claim 5 wherein the memory polynomial model has an output waveform defined by:

$$x_{out}(n) = \Sigma_{j=0}^{M} \Sigma_{i=1}^{N} a_{ji} \cdot x_{in}(n-j) \cdot |x_{in}(n-j)|^{i-1},$$

where $x_{out}$ is an output of the amplifier, $x_{in}$ is an input of the amplifier, N and M are a nonlinearity order and a memory depth, respectively, and $a_{ji}$ are the model coefficients.

7. The method according to claim 1 wherein modeling the current pre-coded constellation using a non-linear model includes modeling the current pre-coded constellation using a Wiener model having an output waveform given by:

$$x_{out}(n) = G(|x_1(n)|) \cdot x_1(n),$$

where $G(|x_1(n)|)$ is a memoryless instantaneous gain function implemented in a look-up table, and $x_1(n)$ designates an output of a filter as:

$$x_1(n) = \Sigma_{j=0}^{M} h(j) \cdot x_{in}(n-j),$$

and where $h(j)$ are the coefficients of a filter impulse response, and M is the memory depth.

8. The method according to claim 1 wherein modeling the current pre-coded constellation using a non-linear model includes modeling the current pre-coded constellation using a Hammerstein model having an output waveform given by:

$$x_{out}(n) = \Sigma_{j=0}^{M} h(j) \cdot x_1(n-j),$$

and:

$$x_1(n) = G(|x_{in}(n)|) \cdot x_{in}(n),$$

where $x_1(n)$, $h(j)$ and $G(|x_1(n)|)$ refer to the output of a look-up table, an impulse response of a filter and an instantaneous gain of a look-up table model, respectively, and M is a memory depth.

9. The method according to claim 1 wherein modeling the current pre-coded constellation using a non-linear model includes modeling the pre-coded constellation using a look-up table (LUT) model as:

$$|x_{in}(n-1), x_{in}(n-2), x_{in}(n-3), \dots, x_{in}(n-M)|,$$

where M is a memory depth, a LUT size is $K^{M=1}$, K is the number of bins required for a memoryless LUT model, and an output waveform is given by:

$$x_{out}(n) = G(|x_1(n)|) \cdot x_{in}(n),$$

where $G(|x_1(n)|)$ is an instantaneous complex gain, $x_{in}(n)$ is an input vector including the present and the M−1 preceding samples, and $x_{in}(n)$ is defined as:

$$|x_1(n)| = |x_{in}(n), x_{in}(n-1), x_{in}(n-2), \dots, x_{in}(n-M)|.$$

10. The method according to claim 1 wherein converting the digital bits to a constellation includes using M-ary amplitude phase shift keying.

11. The method according to claim 1 wherein the communications system is a satellite communications system.

12. The method according to claim 1 wherein filtering the pre-coded constellation includes using a pulse-shaping filter.

13. A method for non-linear pre-coding a single carrier digital signal in a transmitter associated with a digital satellite communications system to remove non-linear distortions in a transmitted signal, said method comprising:
converting digital bits to be transmitted to a transmit constellation including symbols each defining a plurality of the bits using M-ary amplitude phase shift keying;
subtracting a revised pre-coded constellation from the transmit constellation to provide a current pre-coded constellation;
performing a modulo operation on the current pre-coded constellation to limit the number of symbols that are transmitted at any particular point in time;
modeling the current pre-coded constellation after the modulo operation using a Volterra series model, where a plurality of terms in the Volterra series are separately modeled and each modeled term of the constellation is added together to provide the current pre-coded constellation, wherein modeling the current pre-coded constellation using a Volterra series model includes using a non-linear combination of different non-linear models where the different non-linear models are independent of each other and are simultaneously present during the modeling, wherein the non-linear combination of the different non-linear models includes directly evaluating a non-linear function with each of the non-linear models, and wherein the non-linear function is a Taylor series, general power series or any sub-set or combination of a Taylor series and general power series;
filtering the current pre-coded constellation in a pulse-shaping filter so as to interpolate a symbol sequence in the constellation and shape the constellation;
converting the shaped pre-coded constellation to an analog signal to be transmitted; and
amplifying the analog signal in a high power amplifier.

14. The method according to claim 13 wherein modeling the current pre-coded constellation using a Volterra series model includes using the equation:

$$y_n = \sum_{n_1=0}^{N-1} h_1(n_1) X_{n-n_1} + \sum_{n_1=0}^{N-1}\sum_{n_2=0}^{N-1}\sum_{n_3=0}^{N-1} h_3(n_1, n_2, n_3) X_{n-n_1} X_{n-n_2} X^*_{n-n_3} +$$

-continued $$\sum_{n_1=0}^{N-1}\sum_{n_2=0}^{N-1}\sum_{n_3=0}^{N-1}\sum_{n_4=0}^{N-1}\sum_{n_5=0}^{N-1} h_5(n_1, n_2, n_3, n_4, n_5)$$

$$X_{n-n_1} X_{n-n_2} X_{n-n_3} X^*_{n-n_4} X^*_{n-n_5} + \ldots$$

where $h_p(n_1, n_2, \ldots, n_p)$ are Volterra series coefficients of pth order and $h_1(0)$ is the first leading coefficient.

15. A communications system for non-linear pre-coding a single carrier digital signal in a transmitter to remove non-linear distortions in a transmitted signal, said system comprising:
- means for converting digital bits to be transmitted to a transmit constellation including symbols each defining a plurality of the bits;
- means for subtracting a revised pre-coded constellation from the transmit constellation to provide a current pre-coded constellation;
- means for performing a modulo operation on the current pre-coded constellation to limit the number of symbols that are transmitted at any particular point in time;
- means for modeling the current pre-coded constellation after the modulo operation using a non-linear model to provide the revised pre-coded constellation, wherein the means for modeling the current pre-coded constellation uses a non-linear combination of different non-linear models where the different non-linear models are independent of each other and are simultaneously present during the modeling, wherein the non-linear combination of the different non-linear models includes directly evaluating a non-linear function with each of the non-linear models, and wherein the non-linear function is a Taylor series, general power series or any sub-set or combination of a Taylor series and general power series;
- means for filtering the current pre-coded constellation in a pulse-shaping filter so as to interpolate a symbol sequence in the constellation and shape the constellation;
- means for converting the shaped pre-coded constellation to an analog signal to be transmitted; and
- means for amplifying the analog signal in a high power amplifier.

16. The system according to claim 15 wherein the means for modeling the current pre-coded constellation using a non-linear model models the current pre-coded constellation using a Volterra series model, where a plurality of terms in the Volterra series are separately modeled and each modeled term of the constellation is added together to provide the modeled constellation.

17. The system according to claim 16 wherein the means for modeling the current pre-coded constellation using a Volterra series model uses the equation:

$$y_n = \sum_{n_1=0}^{N-1} h_1(n_1) X_{n-n_1} + \sum_{n_1=0}^{N-1}\sum_{n_2=0}^{N-1}\sum_{n_3=0}^{N-1} h_3(n_1, n_2, n_3) X_{n-n_1} X_{n-n_2} X^*_{n-n_3} +$$

$$\sum_{n_1=0}^{N-1}\sum_{n_2=0}^{N-1}\sum_{n_3=0}^{N-1}\sum_{n_4=0}^{N-1}\sum_{n_5=0}^{N-1} h_5(n_1, n_2, n_3, n_4, n_5)$$

$$X_{n-n_1} X_{n-n_2} X_{n-n_3} X^*_{n-n_4} X^*_{n-n_5} + \ldots$$

where $h_p(n_1, n_2, \ldots, n_p)$, are Volterra series coefficients of pth order and $h_1(0)$ is the first leading coefficient.

18. The system according to claim 17 wherein the means for modeling the current pre-coded constellation using a Volterra series model models the linear term of the Volterra series using the expression:

$$\sum_{n_1=1}^{N-1} \frac{h_1(n_1)}{h_1(0)} z^{-1},$$

and modeling the third-order term in the Volterra series using the expression:

$$\sum_{n_1,n_2,n_3=0}^{N-1} \frac{h_3(n_1, n_2, n_3)}{|h_1(0)|^2 h_1(0)} z^{-n_1} z^{-n_2} (z^*)^{-n_3}.$$

* * * * *